(12) United States Patent
Jansen

(10) Patent No.: US 12,270,644 B2
(45) Date of Patent: Apr. 8, 2025

(54) COMPACT DUAL PASS INTERFEROMETER FOR A PLANE MIRROR INTERFEROMETER

(71) Applicant: ASML Netherlands B.V., Veldhoven (NL)

(72) Inventor: Maarten Jozef Jansen, Hoogeloon (NL)

(73) Assignee: ASML NETHERLANDS B.V., Veldhoven (NL)

( * ) Notice: Subject to any disclaimer, the term of this patent is extended or adjusted under 35 U.S.C. 154(b) by 167 days.

(21) Appl. No.: 18/023,482

(22) PCT Filed: Jul. 20, 2021

(86) PCT No.: PCT/EP2021/070250
§ 371 (c)(1),
(2) Date: Feb. 27, 2023

(87) PCT Pub. No.: WO2022/042947
PCT Pub. Date: Mar. 3, 2022

(65) Prior Publication Data
US 2024/0011762 A1    Jan. 11, 2024

(30) Foreign Application Priority Data
Aug. 27, 2020   (EP) ...................................... 20193095

(51) Int. Cl.
*G01B 9/02018*     (2022.01)
*G01B 9/02001*     (2022.01)
(Continued)

(52) U.S. Cl.
CPC ..... *G01B 9/02018* (2013.01); *G01B 9/02057* (2013.01); *G02B 3/0087* (2013.01);
(Continued)

(58) Field of Classification Search
CPC ............ G01B 9/02018; G01B 9/02019; G02B 3/0087; G03F 7/70775
See application file for complete search history.

(56) References Cited

U.S. PATENT DOCUMENTS

| 4,653,922 A | 3/1987 | Jarisch et al. |
| 5,305,088 A | 4/1994 | Hosoe |
(Continued)

FOREIGN PATENT DOCUMENTS

CN    103728866 A    4/2014

OTHER PUBLICATIONS

International Search Report and Written Opinion of the International Searching Authority directed to International Patent Application No. PCT/EP2021/070250, mailed Oct. 22, 2021; 18 pages.
(Continued)

*Primary Examiner* — Michael A Lyons
(74) *Attorney, Agent, or Firm* — Sterne, Kessler, Goldstein & Fox P.L.L.C.

(57) ABSTRACT

A compact dual pass interferometer for a plane mirror interferometer configured to receive an input radiation beam from a light source. An optical component has a partially reflective surface arranged to reflect a first portion of the input radiation beam to follow a first optical path directed towards an output terminal and further arranged to transmit a second portion of the input radiation beam to follow a second optical path, directed towards a first location on a reflective target surface and back to the partially reflective surface, then to a second location on the reflective target surface and back to the partially reflective surface, whereupon the second optical path is directed through the partially reflective surface to be recombined with the first optical path to provide a recombined optical path configured to provide
(Continued)

an output radiation beam. The output terminal configured to deliver the output radiation beam to a detector.

11 Claims, 6 Drawing Sheets

(51) Int. Cl.
  *G01B 9/02056* (2022.01)
  *G02B 3/00* (2006.01)
  *G02B 26/00* (2006.01)
  *G03F 7/00* (2006.01)

(52) U.S. Cl.
  CPC ....... *G02B 26/001* (2013.01); *G03F 7/70775* (2013.01); *G01B 9/02007* (2013.01); *G01B 2290/70* (2013.01)

(56) References Cited

U.S. PATENT DOCUMENTS

| | | | |
|---|---|---|---|
| 6,762,845 | B2 | 7/2004 | Hill |
| 6,952,253 | B2 | 10/2005 | Lof et al. |
| 2008/0074659 | A1 | 3/2008 | Mangan et al. |
| 2011/0055982 | A1* | 3/2011 | Watanabe .............. G01Q 10/04 850/2 |
| 2013/0114061 | A1 | 5/2013 | de Groot et al. |
| 2018/0238676 | A1* | 8/2018 | Bååth ...................... G06T 7/521 |

OTHER PUBLICATIONS

International Preliminary Report on Patentability directed to International Patent Application No. PCT/EP2021/070250, issued Feb. 28, 2023; 15 pages.

Zhou et al., "Dynamic wavefront measurement with a pinhole linear polarizer point-diffraction interferometer," Applied Optics, vol. 56, No. 29, Oct. 10, 2017; pp. 8040-8047.

Nakata et al., "Common-path double-pass optical interferometry using a wire-grid polarizer as a reference mirror," Optical Review, vol. 15, No. 6, Dec. 5, 2008; pp. 276-279.

Malacara et al., "Optical Shop Testing—Chapter 7: Multiple-Pass Interferometers," Third Edition, Jun. 2007; pp. 259-274.

* cited by examiner

COMPACT DUAL PASS INTERFEROMETER FOR A PLANE MIRROR INTERFEROMETER

CROSS-REFERENCE TO RELATED APPLICATION

The application claims priority of EP application 20193095.5 which was filed on Aug. 27, 2020 and which is incorporated herein in its entirety by reference.

FIELD

The present invention relates to an interferometer for a plane mirror interferometer.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a known compact double pass interferometer probe concept, with a single fiber used for input and output of the probe radiation, a tilted target mirror is used to prevent a single pass interferometer signal being sent back into the input fiber. In such a system it is crucial that the first and second reflective surfaces do not coincide, therefore the tilt range of the target is limited. A beam splitter or optical circulator is used to separate the input and output probe radiation.

SUMMARY

In some applications, it is desirable to have a compact double-pass interferometer probe concept that has an unlimited tilt range for the target. Specifically, it is desirable to have a target surface that is capable of being tilted relative to the incident radiation beam and also capable of being aligned perpendicular to the incident radiation beam. For example, in a lithographic apparatus, a cooling hood may be provided, the position of which may be measured using an interferometer system. However, there is little space available for mounting a reflective target and interferometer probe head.

It is an object of an aspect of the invention to provide an improved or at least alternative interferometer for a compact multipass configuration that can be used on a variety of targets mounted on the object of interest, without compromising tilt range.

According to an embodiment of a first aspect of the invention, there is an interferometer comprising:
- an input terminal configured to receive an input radiation beam from a light source,
- an optical component,
  - wherein a surface of the optical component is partially reflective and is arranged to reflect a first portion of the input radiation beam to follow a first optical path and is further arranged to transmit a second portion of the input radiation beam to follow a second optical path,
  - wherein the first optical path is directed towards an output terminal,
  - and the second optical path is directed towards a first location on a reflective target surface and back to the partially reflective surface, then to a second location on the reflective target surface and back to the partially reflective surface,
  - whereupon the second optical path is directed through the partially reflective surface to be recombined with the first optical path to provide to a recombined optical path configured to provide an output radiation beam,
  - the output radiation beam comprising the first portion of the input radiation beam and a component of the second portion of the input radiation beam,
  - and wherein the output terminal is configured to deliver the output radiation beam to a detector.

In embodiments of the first aspect, the partially reflective surface is curved to prevent beam walk-off at the detector.

In embodiments of the first aspect, the interferometer is further comprising a lens positioned whereby the partially reflective surface is in a focal plane of the lens.

In embodiments of the first aspect, the focal distance between the partially reflective surface and the lens is equal to the distance between the lens and the reflective target surface, which eliminates beam walk-off for a certain working distance.

In embodiments of the first aspect, the intensity ratio of the first portion of the input radiation beam and the component of the second portion of the input radiation beam in the recombined beam is approximately equal, which provides approximately 100% fringe contrast.

In an embodiment according to a second aspect of the invention, there is provided an interferometer comprising:
- an input terminal configured to receive a polarized input radiation beam from a light source,
- an optical component comprising:
  - a wire grid polarizer arranged to reflect a first portion of the input radiation beam to follow a first optical path and further arranged to transmit a second portion of the input radiation beam to follow a second optical path, wherein the first optical path is directed towards an output terminal,
  - a first reflective surface and a second reflective surface, wherein the second optical path is directed towards a first location on a reflective target surface and back to the wire grid polarizer via the first reflective surface, and the second optical path is further directed towards a second location on the reflective target surface and back to the wire grid polarizer via the second reflective surface, wherein a quarter wave plate is positioned between the optical component and the reflective target surface, and the second optical path is further directed through the wire grid polarizer to be recombined with the first optical path to provide to a recombined optical path configured to provide an output radiation beam, the output radiation beam comprising the first and second portions of the input radiation beam, and wherein the output terminal is configured to deliver the output radiation beam to a detector.

In an embodiment according to a third aspect of the invention, there is provided an interferometer comprising:

a terminal configured to receive a polarized input radiation beam from a light source, a wire grid polarizer at a focal plane of the input radiation beam and a lens, wherein the wire grid polarizer is arranged to reflect a first portion of the input radiation beam to follow a first optical path and is further arranged to transmit a second portion of the input radiation beam to follow a second optical path, wherein the first optical path is directed towards the terminal, and the second optical path is directed towards a location on the reflective target surface and back to the wire grid polarizer then again to the location on the reflective target surface and back to the wire grid polarizer, wherein a quarter wave plate is positioned between the wire grid polarizer and the reflective target surface, and the second optical path is further directed through the wire grid polarizer to be recombined with the first optical path to provide to a recombined optical path configured to provide an output radiation beam, the output radiation beam comprising the first and second portions of the input radiation beam, and wherein the terminal is further configured to deliver the output radiation beam to a detector.

In embodiments, the reflective target surface is orthogonal to the beam that is incident upon said reflective target surface. This has the advantage of avoiding a loss of signal, and the tilt range of the target is uncompromised.

In embodiments, there is provided an interferometer comprising:

receiving means for receiving an input radiation beam from a light source;

path-providing means for providing a first optical path and a second optical path, wherein a first portion of the input radiation beam is arranged to follow the first optical path and a second portion of the input radiation beam is arranged to follow the second optical path, wherein the second optical path is arranged to pass twice between said path-providing means and a reflective target surface, said path-providing means further providing a recombined optical path, wherein the recombined optical path follows the first optical path, said recombined optical path providing an output radiation beam, wherein the output radiation beam comprises an interference signal, said path-providing means further arranged to prevent the beam following the second optical path from being directed to the recombined optical path after the first pass between said path-providing means and the reflective target surface;

directing means to direct the second optical path to the reflective target surface; and means for delivering the output radiation beam to a detector.

In embodiments according to the first and second aspects of the invention, the directing means directs the second optical path to a first location on the reflective target surface, and further directs the second optical path to a second location on the reflective target surface, wherein the first and second locations are spatially separated.

The invention further relates to a lithographic apparatus comprising the interferometer system for determining a position of a target surface according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
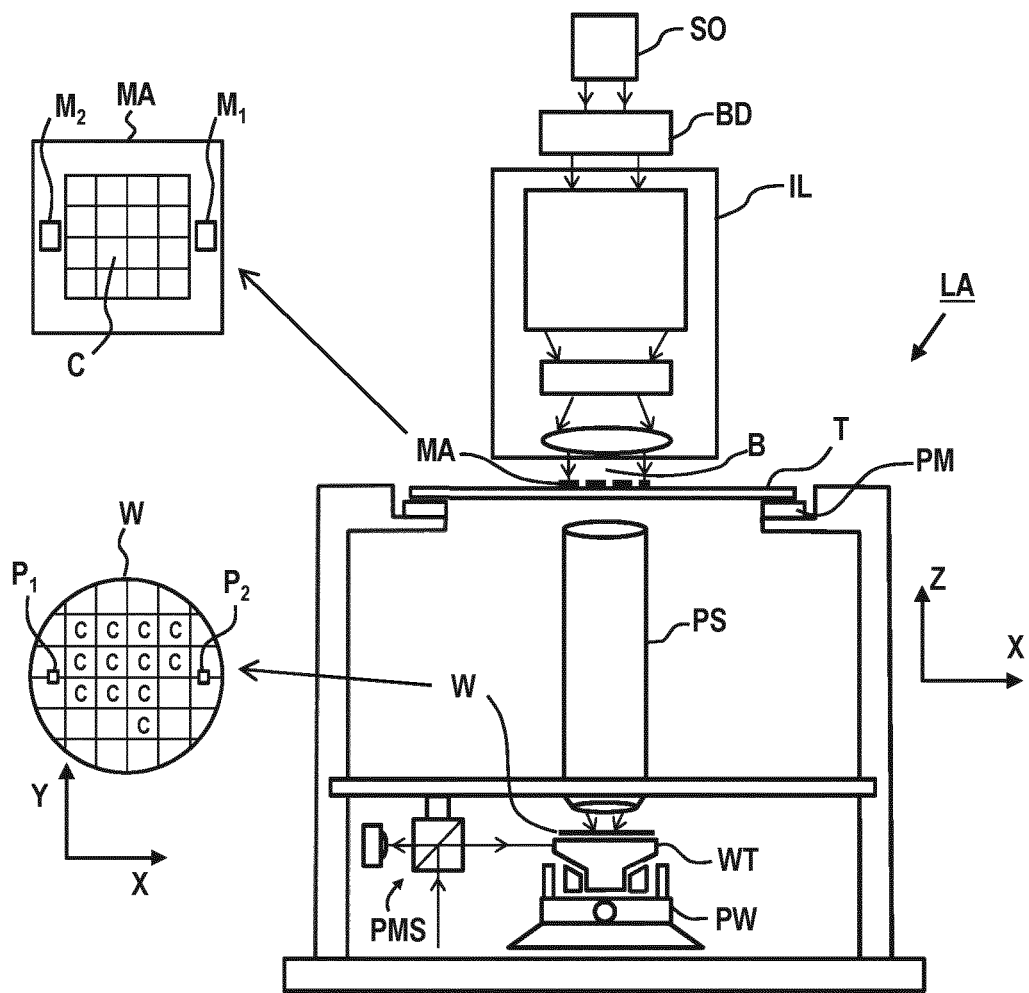
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such a "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

An interferometer according to an embodiment of the invention may be arranged as part of a system to determine an absolute position of a movable object, for example a movable part of a projection system PS of a lithographic apparatus. The movable object may also be a mask support or a substrate support of a lithographic apparatus. The movable object comprises a reflective measurement surface, or target. The target may be one of a variety of materials, for example it may be a retroreflector or a planar mirror. The target may also be positioned without compromise to its tilt range, and can for example be positioned orthogonally to the portion of the input radiation beam that is incident upon its surface. This has the advantage of avoiding a loss of signal.

The interferometer may be implemented in interferometer systems which use alternative phase measuring methods, for example in a heterodyne interferometer system, in a homodyne interferometer system, or in a synthetic heterodyne interferometer system.

Figure 2:
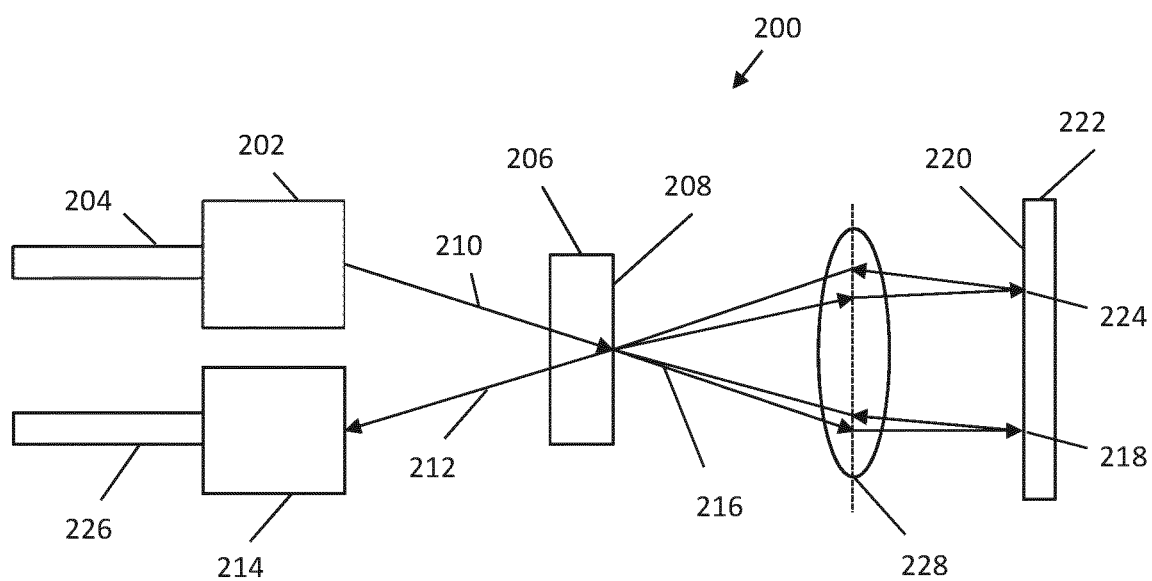
FIG. 2 schematically depicts an embodiment of an interferometer system according to a first embodiment of a first aspect of the invention.

FIG. 2 schematically illustrates an interferometer 200 according to a first embodiment of a first aspect of the invention. Beam delivery to the interferometer 200 is via an input terminal 202 of the interferometer 200. Input terminal 202 is configured to receive an input radiation beam from a light source and may be connected to a first optical fiber 204 to deliver said input radiation beam. The first optical fiber 204 is preferably an angled physical contact (APC) fiber, to prevent back-reflections and maintain a desired direction of propagation of the input radiation. Alternatively, the input terminal 202 may receive a light beam from a free space light source, for example a point source. An optical component (not shown) may collimate the input radiation beam. This optical component is typically a collimator lens, which may optionally be located at the output of the first optical fiber 204, or where a free space light source is used, at the output of the light source. The input radiation may be unpolarized or polarized. For best performance, typically a polarization-stable input beam is preferred.

The interferometer comprises an optical component 206 having a reference surface 208. The optical component 206 is arranged such that a focal point of the incident radiation beam 210 is produced on the reference surface 208 of the optical component 206. The reference surface 208 is partially reflective and acts as a beam splitter. The incident radiation beam 210 is split at reference surface 208: a first portion of the incident radiation beam 210 is reflected by the reference surface 208 to produce a reference beam, and a second portion of the incident radiation beam 210 is transmitted through the reference surface 218 to produce a measurement beam. The first portion of the incident radiation beam follows a first optical path 212 which is directed towards an output terminal 214. The measurement beam follows a second optical path 216 towards a first location 218 on a reflective surface 220 of a target 222. The measurement beam is accordingly reflected from the reflective target surface 220 in a first beam pass, such that the second optical path is directed back to the reference surface 208. A portion of the measurement beam incident on the reference surface 208 is reflected again towards the reflective target surface 220, such that the second optical path 216 is directed towards a second location 224 on the reflective target surface 220, and subsequently is directed back to the reference surface 208 in a second beam pass. The first location 218 and the second location 224 are spatially separated. Optionally, the target 222 may comprise a first retroreflector at first location 218 to reflect the first beam pass and a second retroreflector at second location 224 to reflect the second beam pass. At reference surface 208 a further portion of the measurement beam, having been reflected twice at the reflective target surface 220, is transmitted, such that the second optical path 216 is directed through the reference surface 208 towards the output terminal 214. The second optical path 216 is thus recombined with the first optical path 212 to provide a recombined optical path. The recombined optical path follows the first optical path 212 and is configured to provide a recombined beam comprising the reference beam and a portion of the measurement beam, which is the output radiation beam and contains an interference signal. The portion of the beam which is transmitted through the partially reflective surface following the first beam pass reflected from the target surface does not follow the recombined optical path, and thus does not comprise part of the output radiation beam. The output terminal 214 is configured to deliver the output radiation beam to a detector.

The output terminal 214 may be arranged to be connected to a second optical fiber 226 to deliver the recombined beam, and accordingly output radiation, to a detector. The second optical fibre 226 is preferably an angled physical contact (APC) fiber, to prevent back-reflections and maintain a desired direction of propagation of the input radiation. Alternatively, the output terminal 214 is arranged or combined with optics to deliver a focused recombined beam, and accordingly the output radiation, to a detector in free space. The use in the present invention of a first optical fiber 204 to deliver input radiation and a second optical fiber 226 to receive output radiation advantageously removes the need for a circulator in any resultant system, which would otherwise be required to direct the interferometer signal towards an optical detector instead of towards the light source. This reduces the number of components required in the system, and reduces the overall cost.

In the first embodiment, a lens 228 is located between the reference surface 208 and the reflective target surface 220. In this embodiment the reference surface 208 is positioned in the focal plane of the lens 228. In this arrangement, the combination of the reference surface 208 and the lens 228 acts as a cat's eye retroreflector. Lens 228 may be for example a collimating lens, a gradient index lens or a relay lens.

The reference surface 208 may be curved to prevent beam walk-off at the detector. Alternatively, the focal distance may be chosen to be equal to the distance of the target surface, which eliminates beam walk-off for a certain working distance.

Figure 3A:
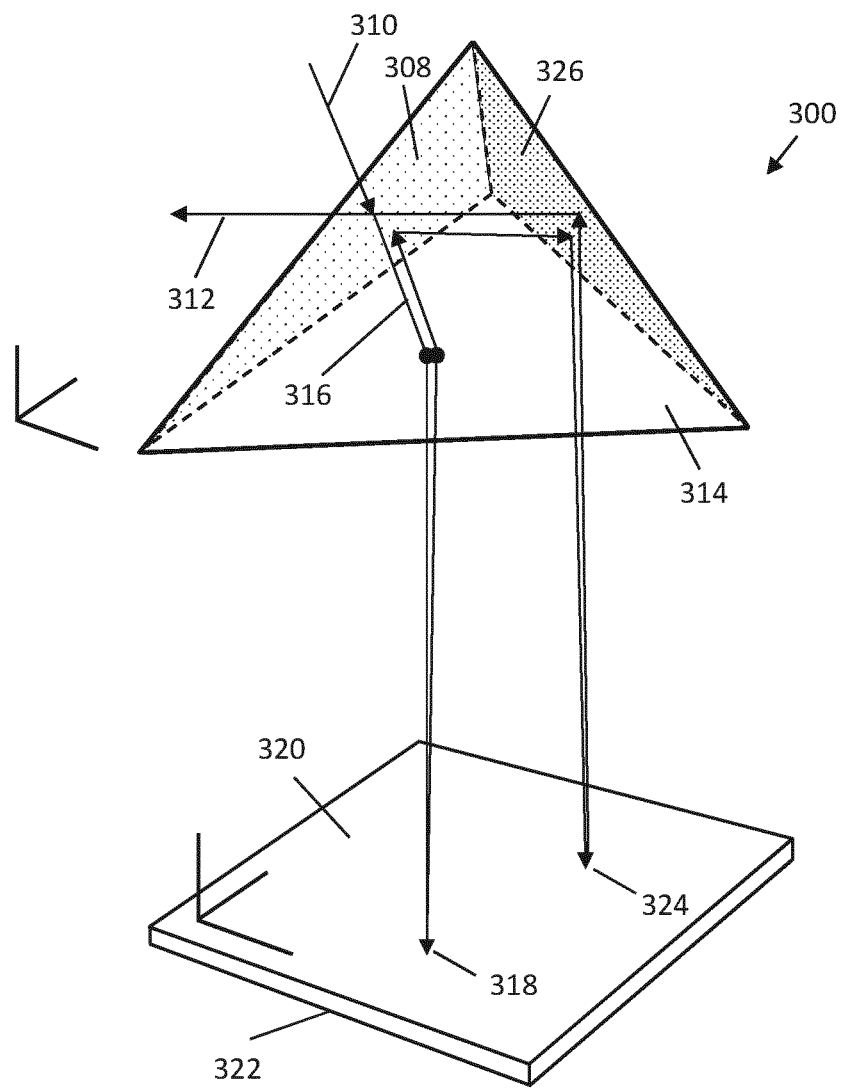
FIG. 3A schematically depicts a perspective view of a second embodiment of an interferometer system according to the first aspect of the invention.
Figure 3B:
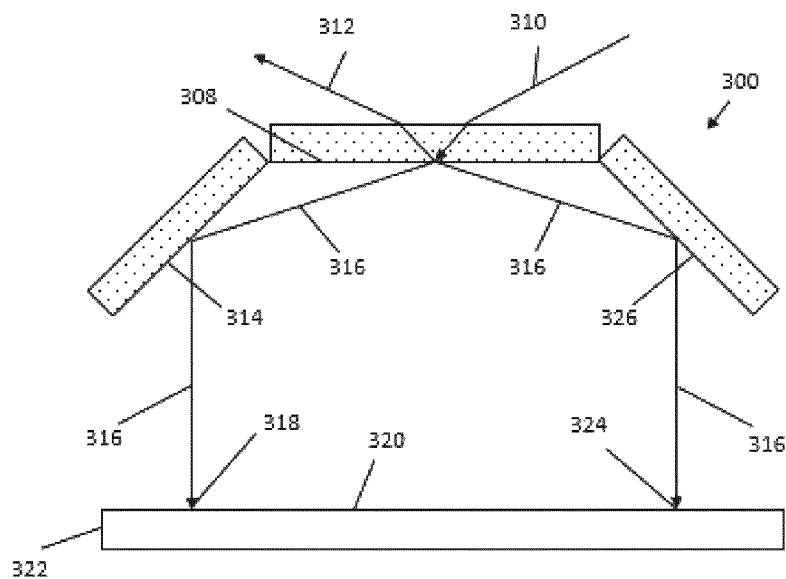
FIG. 3B is a sectional view of the embodiment of the interferometer system of FIG. 3A, shown in the plane of the radiation beam.

In a second embodiment of the first aspect, the optical component 206 may have multiple surfaces. For example, the optical component 206 may be a hollow retroreflector, such as a hollow prism. The prism may be any appropriate shape, for example a triangular prism. The prism acts as a retroreflector, without the need for any additional lens 228. A perspective view of an interferometer 300 according to the second embodiment with a hollow triangular prism is shown in FIG. 3A. FIG. 3B is a sectional view of the interferometer illustrated in FIG. 3A, shown in the plane of the radiation beam. In FIGS. 3A and 3B, a collimated radiation beam 310 is incident on a first surface of the prism. The first surface is the reference surface 308 which is partially reflective such that the incident radiation beam 310 is split: a first portion of the incident radiation beam 310 is reflected by the reference surface 308 to produce a reference beam, and a second portion of the incident radiation beam is transmitted through the reference surface 308 to produce a measurement beam. The reference beam follows a first optical path 312 which is directed towards an output terminal (not shown). The measurement beam follows a second optical path 316, traveling inside the prism from the reference surface 308 towards a second surface 314 of the prism. The second surface 314 of the prism is preferably 100% reflective, and thus reflects the measurement beam. The second surface 314 of the prism is further arranged such that the second optical path 316 is directed to a first location 318 on a reflective surface 320 of a target 322. The measurement beam is accordingly reflected from the reflective target surface 320 in a first beam pass, such that the second optical path 316 is directed back to the second surface 314 of the prism, where the measurement beam is reflected a second time from the second surface 314 and the second optical path 316 is directed back towards the reference surface 308 in a first beam pass. At the reference surface 308, a portion of the measurement beam is reflected towards a third surface 326 of the prism. The third surface 326 of the prism is preferably 100% reflective and thus reflects the incident portion of the measurement beam. The third surface 326 is further arranged such that the second optical path 316 is directed from the third surface 326 to a second location 324 on the reflective target surface 320. The first location 218 and the second location 224 are spatially separated. At the second location 324 of the reflective target surface 320, the incident portion of the measurement beam is reflected such that the second optical path 316 travels back towards the third surface 326 of the prism. The portion of the measurement beam incident on the third surface 326 of the prism a second time is reflected towards the reference surface 308 in a second beam pass and a component of the beam is transmitted therethrough. Optionally, the target 222 may comprise a first retroreflector at first location 218 to reflect the first beam pass and a second retroreflector at second location 224 to reflect the second beam pass. The second optical path 316 is directed from the third surface 326 of the prism towards and through the reference surface 308 of the prism, to be recombined with the first optical path 312 to provide a recombined optical path. The recombined optical path follows the first optical path 312 and is configured to provide a recombined beam, which is the output radiation beam. The portion of the beam which is transmitted through the partially reflective surface following the first beam pass reflected from the target surface and second surface 314 does not follow the recombined optical path, and thus does not comprise part of the output radiation beam. The output terminal (not shown) is configured to deliver the output radiation beam to a detector.

Figure 4:
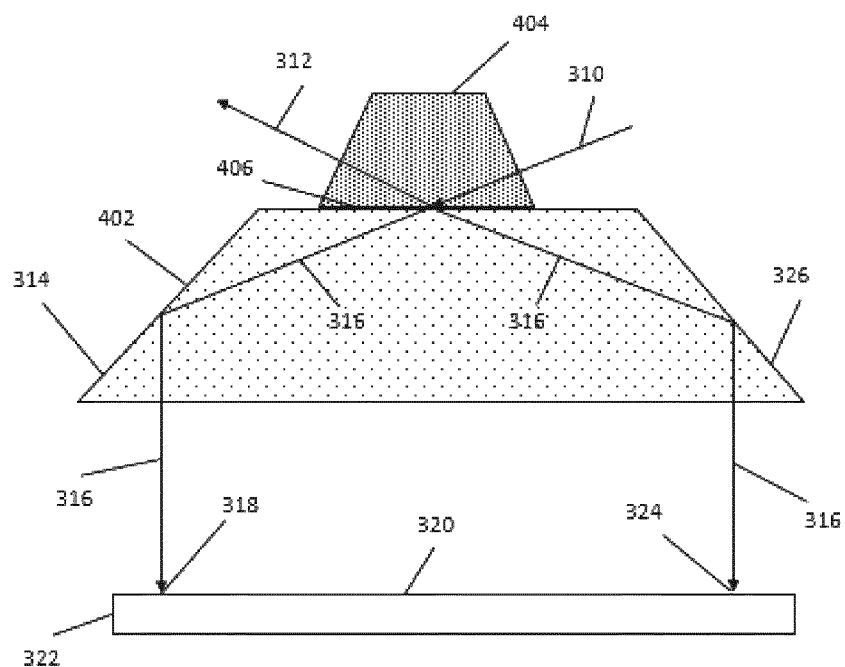
FIG. 4 is a sectional view of a third embodiment of the first aspect of the invention.

In an alternative embodiment shown in FIG. 4, the optical component may be a solid retroreflector 402 having a refractive index $\eta_1$, for example a solid prism. In such an embodiment, an additional solid body 404, which may also have the form of a prism, having a different refractive index $\eta_2$ to that of the solid retroreflector 402 is attached to the retroreflector and a low reflectivity coating 406 is provided between the solid retroreflector 402 and the additional body 404. The additional solid body 404 increases the critical angle $\theta_c$ at which light may be coupled into the solid retroreflector 402 and thus ensures that incident radiation can be couple into or out of the retroreflector with the appropriate angle, avoiding total internal reflection. The solid retroreflector 402 and the additional solid body 404 may be attached by any appropriate means.

In all embodiments incorporating the partially reflective surface, it is preferable that the intensity ratio of the first portion of the input radiation beam and the component of the second portion of the input radiation beam are approximately equal. Preferably, the intensity of each of the beams in the recombined beam is in the range of 3.5-10.5% of the input radiation beam. Thus, the reflectivity and transmittance of the reference surface may be selected so as to enable an approximately equal magnitude of intensity of the reference beam and the portion of the measurement beam in the recombined beam. For example, the reflectivity of the reference surface may be selected to be 4%, while the transmission of the reference surface may correspondingly be selected to be 96%.

The arrangements of embodiments described above and illustrated in FIGS. 2-4 ensure that the reflective target surface may be tilted at any angle to the measurement beam, including at normal incidence, without the risk that the first pass radiation is guided towards the output. A compact, plane mirror, dual-pass interferometer having a large distance range and large tilt range is provided. The embodiments described above can be used with randomly polarized light but are preferably used with a stable polarization angle. When using unstable polarised light, the optical path travelled by one polarization may differ slightly to that travelled by another, in which case a corrective waveplate may be added to the prism to compensate for possible retardation effects.

Figure 5:
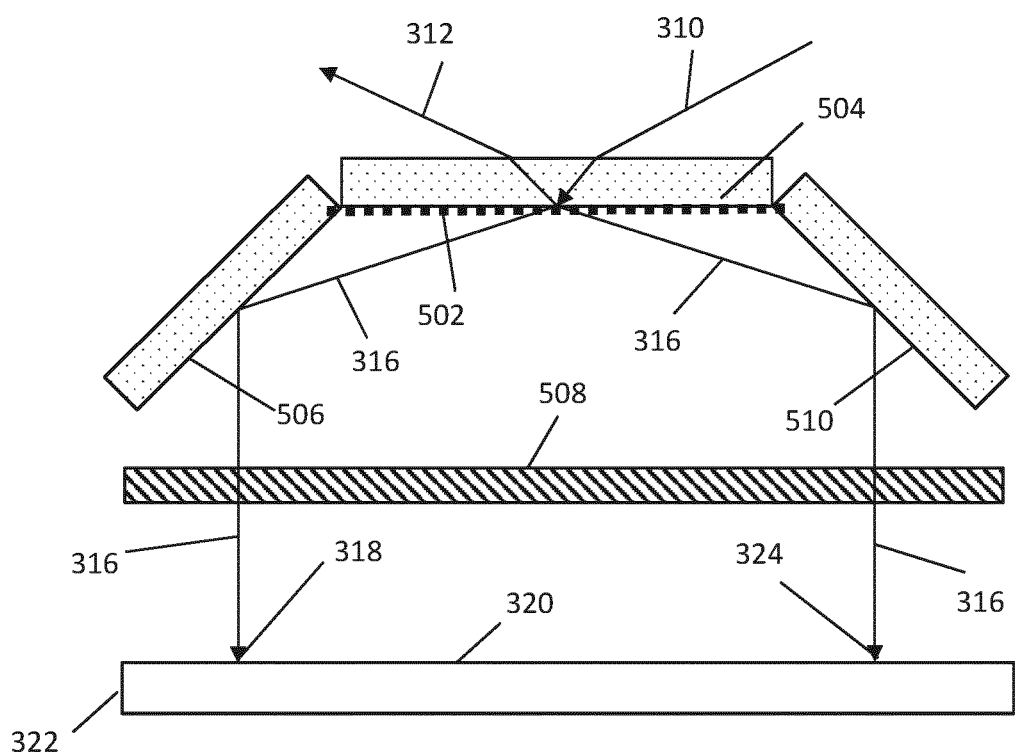
FIG. 5 is a sectional view of an embodiment of a second aspect of the invention.

An embodiment according to a second aspect using polarized light is shown in FIG. 5. In this embodiment, the reference surface is a polarizing beam splitter, for example a wire grid polarizer 502. Wire grid polarizers are available as structures on plastic films or as aluminum wires on glass. A quarter waveplate 504 is present between the reflective target surface 320 and the interferometer. The reference beam and measurement beams are orthogonally polarized, and an analyzing polarizer is required to make the reference beam and the measurement beam interfere. If a polarizing beam splitter is used as per the embodiment shown in FIG. 5 then the input polarization must be stable and separate input and output fibers should be used. This allows the use of traditional polarization-based homodyne phase analyzers. A non-polarizing beam splitter limits the phase detection to synthetic homodyne phase detection which typically requires a laser current or phase modulator applied to either the reference beam or the measurement beam. Current induced frequency modulation allows for synthetic heterodyne phase detection.

In FIG. 5, the optical component has multiple surfaces and, similar to the embodiment shown in FIGS. 3A and 3B, is formed as a hollow prism. The prism may be any appropriate shape, for example a triangular prism. The prism acts as a retroreflector, without the need for any additional lens. FIG. 5 shows is a sectional view of the interferometer, shown in the plane of the radiation beam, similar to that of FIG. 3B. A collimated radiation beam 310 is incident on wire grid polariser 502, which may be attached to a first surface 504 of the prism. The wire grid polarizer 502 is arranged to reflect a first portion of the input radiation beam 310 to produce a reference beam, and a second portion of the incident radiation beam is transmitted through the wire grid polarizer to produce a measurement beam. The first portion of the incident radiation beam, i.e. the reference beam, follows a first optical path 312 which is directed towards an output terminal (not shown). The measurement beam follows a second optical path 316 through the wire grid polarizer 502 and is directed to a second surface 506 of the prism. The second surface 506 of the prism is preferably 100% reflective, and thus reflects the measurement beam. The second surface 506 should have as little impact on the polarization of the reflected beams as possible. Small amounts of polarization leakage would not have a significant impact on the interferometer performance but may contribute to a small cyclic error contribution. The second surface 506 of the prism is further arranged such that the second optical path 316 is directed through a quarter wave plate 508 and further towards a first location 318 on a reflective surface 320 of a target 322. Advantageously, and optionally, a retroreflector may be used as a target. The measurement beam is accordingly reflected from the reflective target surface 320 in a first pass, such that the second optical path is directed back through quarter wave plate 508 and back to the second surface 506 of the prism, where the measurement beam is reflected a second time from the second surface 506, this time towards the wire grid polarizer 502. Due to the measurement beam passing two times through the quarter wave plate 508, its polarization is rotated 180°. Accordingly, the first pass measurement beam is not transferred to the output radiation beam and, at the wire grid polarizer 502, the measurement beam is reflected and the second optical path 316 is directed towards a third surface 510 of the prism. The third surface 510 is preferably 100% reflective and thus reflects the incident portion of the measurement beam. The third surface 510 should have as little impact on the polarization of the reflected beams as possible. Small amounts of polarization leakage would not have a significant impact on the interferometer performance but may contribute to a small cyclic error contribution. The third surface 510 is further arranged such that the second optical path 316 is directed through quarter wave plate 508 to a second location 324 on the reflective target surface 320. The first location 318 and the second location 324 are spatially separated. Optionally, the target 322 may comprise a first retroreflector at first location 318 to reflect the first beam pass and a second retroreflector at second location 324 to reflect the second beam pass. At the second location 324 of the reflective target surface 320, the incident portion of the measurement beam is reflected such that the second optical path 316 travels back through the quarter wave plate 508 to the third surface 510 of the prism. The measurement beam incident on the third surface 510 of the prism a second time is reflected towards the wire grid polarizer 502. Due to the second pass of the measurement beam two times through the quarter wave plate 508, its polarization is again rotated 180°, and the measurement beam is transmitted through the wire grid polarizer 502. Accordingly, the second optical path 316 is recombined with the first optical path 312 to provide a recombined optical path. The recombined optical path follows the first optical path 312. The recombined optical path is configured to provide a recombined beam, which is the output radiation beam. The output radiation beam comprises the first and second portions of the input radiation beam. An output terminal (not shown) is configured to deliver the output radiation beam to a detector.

Advantageously, the embodiments of the present invention described above may provide 100% fringe contrast and low (0.1≤0.2%) incidence of ghost reflections. The arrangements described above, wherein a cat's eye retroreflector is functionally incorporated into the interferometer, advantageously present a compact interferometer avoiding the need for bulky beam-splitting optics. Furthermore, the arrangement enables a reflective target to be positioned orthogonally to its incident radiation beam, which further decreases the overall footprint of the resulting interferometer as well as avoiding any signal loss. Fewer components also result in a lower overall cost to the system.

Figure 6:
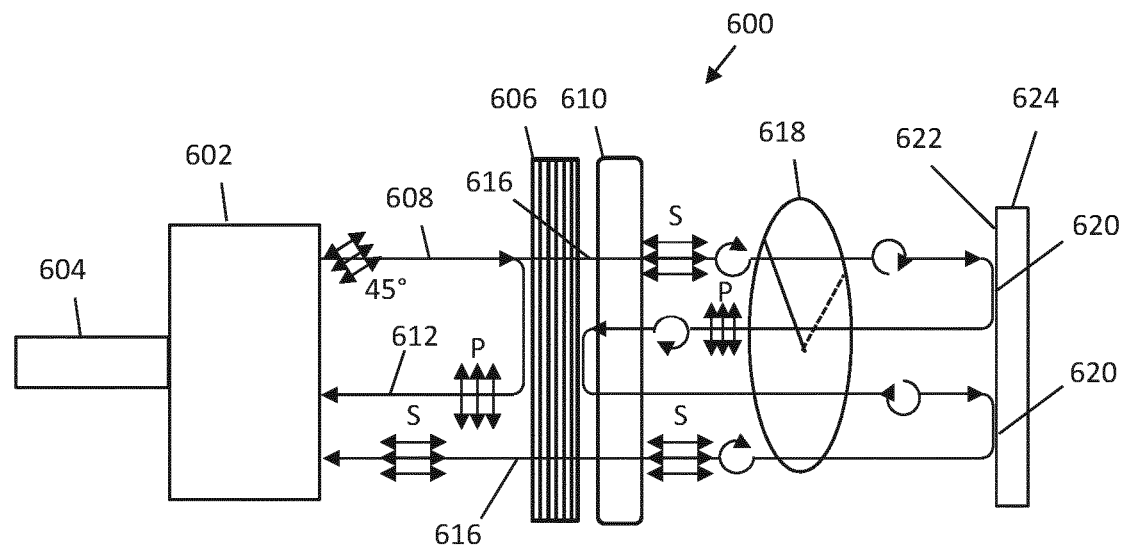
FIG. 6 schematically depicts an embodiment of an interferometer system according to a third aspect of the invention.

According to a third aspect of the invention, shown in FIG. 6, an interferometer 600 is presented for use with polarized radiation. In a first embodiment, a terminal 602 of the interferometer is configured to receive a polarized input radiation beam from a light source. The terminal is preferably connected to an optical fiber 604 to deliver the polarized input radiation beam. Terminal 602 and fiber 604 are also used in this embodiment to receive the output radiation beam. Fiber 604 is preferably a polarization-maintaining fiber and acts as a clean-up and analysing polarizer.

The interferometer 600 comprises an optical system including a wire grid polarizer 606 at a focal plane of the input radiation beam 608, and a lens 610. The wire grid polarizer 606 and the lens 610 in combination function as a cat's eye retroreflector. Lens 610 may be for example a collimating lens, a gradient index lens or a relay lens. The wire grid polarizer 606 is arranged to reflect a first portion of the input radiation beam 608 to produce a reference beam, and a second portion of the incident radiation beam is transmitted through the wire grid polarizer to produce a measurement beam. The first portion of the incident radiation beam, i.e. the reference beam, follows a first optical path 612 which is directed towards terminal 602. The measurement beam follows a second optical path 616 through the wire grid polarizer 606 and lens 610, and further through a quarter wave plate 618 towards a location 620 on a reflective surface 622 of a target 624. Advantageously, and optionally, a retroreflector may be used as a target 624. The measurement beam is accordingly reflected from the reflective target surface 622, such that the second optical path is directed back through the quarter wave plate 618 and back to the wire grid polarizer 606 in a first beam pass. Due to the measurement beam passing two times through the quarter wave plate 618, its polarization is rotated 180°. Accordingly, at the wire grid polarizer 606, the measurement beam is reflected and the second optical path 616 is directed again through the quarter wave plate 618 and towards the location 620 on the reflective surface 622 of a target 624. Although the first and second passes are shown in FIG. 6 as being at different locations, this is to aid understanding only. The first and second passes on the reflective surface 622 of target 624 are not spatially separated. Accordingly, the first pass measurement beam is not transferred to the output radiation beam.

The measurement beam is reflected a second time from the reflective target surface 622 in a second beam pass, such that the second optical path 616 is directed back through the quarter wave plate 618 and back to the wire grid polarizer 606. Due to the second pass of the measurement beam two times through the quarter wave plate 618, its polarization is again rotated 180°, and the measurement beam is transmitted through the wire grid polarizer 606. Accordingly, the second optical path 616 is directed through the wire grid polarizer 606 towards the terminal 602. The second optical path 616 is thus recombined with the first optical path to provide a recombined optical path. The first optical path 612 and the second optical path 616 are shown separately when directed towards terminal 602 in FIG. 6 for illustration purposes only; the recombined optical path follows the first optical path 612. The recombined optical path is configured to provide a recombined beam, which is the output radiation beam. The output radiation beam comprises the first and second portions of the input radiation beam. The terminal 602 is configured to deliver the output radiation beam to a detector, in this embodiment via fiber 604.

Figure 7:
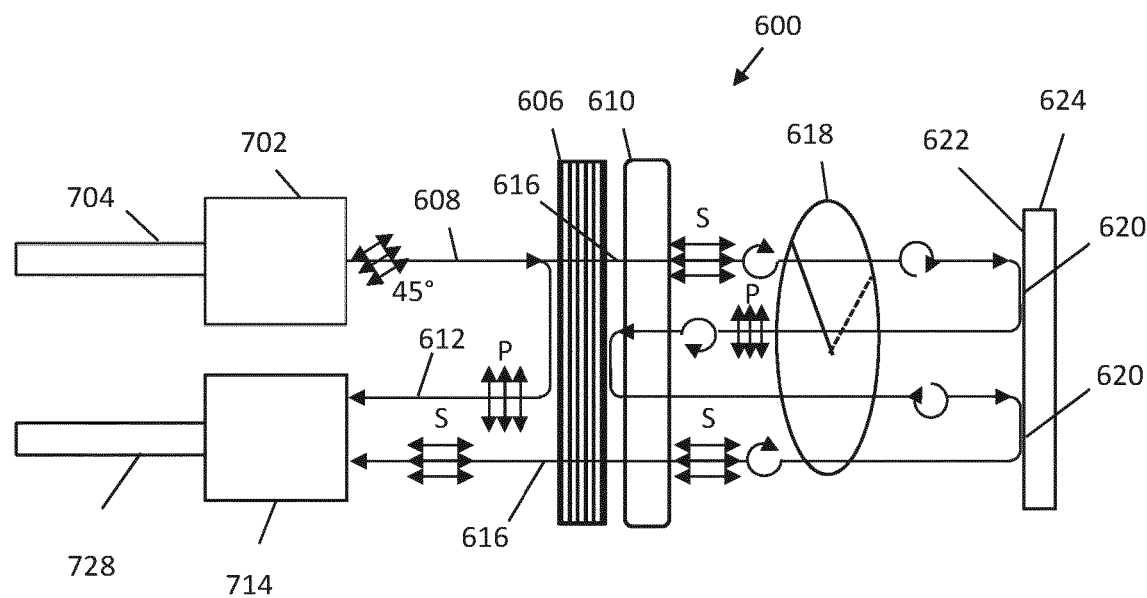
FIG. 7 schematically depicts a second embodiment of an interferometer system according to the third aspect of the invention.

In a further embodiment, illustrated in FIG. 7, terminal 602 may comprise a separate input terminal 704 and output terminal 728. The input terminal 702 may be connected to a first optical fiber 704 to receive the input radiation beam, and the output terminal may be connected to a second optical fiber 728 to deliver the recombined beam, and accordingly output radiation, to the detector. The first optical fiber 704 is preferably an angled physical contact (APC) fiber, to prevent back-reflections and maintain a desired direction of propagation of the input radiation. Alternatively, the input terminal 702 may receive a light beam from a free space light source, for example a point source. An optical component (not shown) may collimate the input radiation beam. This optical component is typically a collimator lens, which may optionally be located at the output of the optical fiber 704, or where a free space light source is used, at the output of the light source. The second optical fibre 728 is preferably an angled physical contact (APC) fiber, to prevent back-reflections and maintain a desired direction of propagation of the input radiation. Alternatively, the output terminal 714 is arranged or combined with optics to deliver a focused recombined beam, and accordingly the output radiation, to a detector in free space.

Optionally, a homodyne phase analyser may be used to separate the reference and measurement beams in the recombined beam. In such an embodiment, the phase analyser comprises a quarter wave plate combined with a polarization sensitive camera.

In the exemplary embodiments illustrated in FIGS. 6 and 7, incident radiation on the wire grid polariser 606 is polarised by 45°, and the wire grid polarizer 606 is arranged such that the S-component of any incident radiation is transmitted through the wire grid polarizer 606, while the P-component of any incident radiation is reflected from the wire grid polarizer 606. In this way, a dual-pass interferometer is provided.

In the absence of a polarization-maintaining fibre acting as an analysing polarizer for the output radiation beam, an analysing polarizer may be provided at the output terminal.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An interferometer comprising:
an input terminal configured to receive a polarized input radiation beam from a light source, and
an optical component comprising:
a wire grid polarizer arranged to reflect a first portion of the input radiation beam to follow a first optical path and further arranged to transmit a second portion of the input radiation beam to follow a second optical path, wherein the first optical path is directed towards an output terminal; and
a first reflective surface and a second reflective surface, wherein the second optical path is directed towards a first location on a reflective target surface and back to the wire grid polarizer via the first reflective surface, and the second optical path is further directed towards a second location on the reflective target surface and back to the wire grid polarizer via the second reflective surface, wherein a quarter wave plate is disposed between the optical component and the reflective target surface, and the second optical path is further directed through the wire grid polarizer to be recombined with the first optical path to provide to a recombined optical path configured to provide an output radiation beam;
the output radiation beam comprising the first and second portions of the input radiation beam, and
wherein the output terminal is configured to deliver the output radiation beam to a detector.

2. The interferometer of claim 1, wherein an analyzing polarizer is provided at the output terminal configured to deliver the output radiation beam.

3. The interferometer of claim 1, wherein the input radiation beam is polarized by 45 degrees.

4. The interferometer of claim 1, wherein the reflective target surface is orthogonal to the input radiation beam that is incident upon the reflective target surface.

5. The interferometer of claim 1, wherein the interferometer is part of a heterodyne interferometer system.

6. An interferometer comprising:
a terminal configured to receive a polarized input radiation beam from a light source; and
a wire grid polarizer at a focal plane of the input radiation beam and a lens,
wherein the wire grid polarizer is arranged to reflect a first portion of the input radiation beam to follow a first optical path and is further arranged to transmit a second portion of the input radiation beam to follow a second optical path,
wherein the first optical path is directed towards the terminal, and the second optical path is directed towards a location on a reflective target surface and back to the wire grid polarizer then again to the location on the reflective target surface and back to the wire grid polarizer,
wherein a quarter wave plate is disposed between the wire grid polarizer and the reflective target surface, and the second optical path is further directed through the wire grid polarizer to be recombined with the first optical path to provide to a recombined optical path configured to provide an output radiation beam;
the output radiation beam comprising the first and second portions of the input radiation beam, and
wherein the terminal is further configured to deliver the output radiation beam to a detector.

7. The interferometer of claim 6, wherein the lens is a collimating lens.

8. The interferometer of claim 6, wherein the lens is a gradient index lens.

9. The interferometer of claim 6, wherein the terminal is connected to a single fiber to receive the input radiation beam and to deliver the output radiation beam.

10. The interferometer of claim 6, wherein the terminal comprises separate input and output terminals, the input terminal arranged to receive the input radiation beam and the output terminal arranged to receive the output radiation beam.

11. A lithographic apparatus comprising:
an interferometer comprising:
a terminal configured to receive a polarized input radiation beam from a light source; and
a wire grid polarizer at a focal plane of the input radiation beam and a lens,
wherein the wire grid polarizer is arranged to reflect a first portion of the input radiation beam to follow a first optical path and is further arranged to transmit a second portion of the input radiation beam to follow a second optical path, wherein the first optical path is directed towards the terminal, and the second optical path is directed towards a location on a reflective target surface and back to the wire grid polarizer then again to the location on the reflective target surface and back to the wire grid polarizer, wherein a quarter wave plate is disposed between the wire grid polarizer and the reflective target surface, and the second optical path is further directed through the wire grid polarizer to be recombined with the first optical path to provide to a recombined optical path configured to provide an output radiation beam;

the output radiation beam comprising the first and second portions of the input radiation beam; and wherein the terminal is further configured to deliver the output radiation beam to a detector.

* * * * *